(12) United States Patent
Uchida

(10) Patent No.: US 7,224,031 B2
(45) Date of Patent: May 29, 2007

(54) SEMICONDUCTOR WAFER AND MANUFACTURING METHOD THEREOF

(75) Inventor: Hiroaki Uchida, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 296 days.

(21) Appl. No.: 11/029,648

(22) Filed: Jan. 6, 2005

(65) Prior Publication Data

US 2005/0176208 A1 Aug. 11, 2005

(30) Foreign Application Priority Data

Jan. 6, 2004 (JP) ............... 2004-001271
Apr. 20, 2004 (JP) ............... 2004-123638

(51) Int. Cl.
*H01L 29/786* (2006.01)
(52) U.S. Cl. ............... 257/347; 257/E27.112
(58) Field of Classification Search ............... 257/347, 257/E27.112
See application file for complete search history.

(56) References Cited

U.S. PATENT DOCUMENTS 4,442,178 A * 4/1984 Kimura et al. ............... 428/446
4,662,059 A * 5/1987 Smeltzer et al. ............... 438/150
5,877,094 A 3/1999 Egley et al.
6,238,935 B1 5/2001 Egley et al.
6,864,534 B2 * 3/2005 Ipposhi et al. ............... 257/627
6,953,948 B2 * 10/2005 Sakaguchi .................. 257/48
2001/0038153 A1 * 11/2001 Sakaguchi .................. 257/797

FOREIGN PATENT DOCUMENTS

| JP | 8-254415 | 10/1996 |
| JP | 11-220114 | 8/1999 |
| JP | 2000-36585 | 2/2000 |

* cited by examiner

Primary Examiner—Asok Kumar Sarkar
(74) Attorney, Agent, or Firm—Rabin & Berdo, P.C.

(57) ABSTRACT

The present invention provides a semiconductor wafer comprising an insulated board of sapphire or the like having translucency, which is provided with a positioning orientation flat at a peripheral portion thereof, and a silicon thin film formed over the entire one surface of the insulated board. In the semiconductor wafer, ions are implanted in an area containing the orientation flat at a peripheral portion of the silicon thin film to amorphize silicon. Thus, the translucency at the amorphized spot is eliminated and accurate positioning using the conventional optical sensor can be performed.

2 Claims, 4 Drawing Sheets

SEMICONDUCTOR WAFER AND MANUFACTURING METHOD THEREOF

BACKGROUND OF THE INVENTION

1. Field of the Invention

The present invention relates to a semiconductor wafer in which a silicon thin film is formed over the surface of a transparent insulated board, like SOS (Silicon on Sapphire) or the like, and a method of manufacturing the semiconductor wafer.

2. Description of the Related Art

In a wafer process for manufacture of a semiconductor device, a positioning orientation flat is previously provided at one point on the circumference of a disk type semiconductor wafer. A stage with the semiconductor wafer mounted thereon is rotated and the orientation flat is detected by a photosensor or optical sensor using visible light (e.g., laser light having a wavelength of 633 nm), thereby performing accurate positioning of the semiconductor wafer. In the case of a silicon wafer using a general silicon substrate, the thickness of the silicon substrate is greater than or equal to a predetermined thickness. Therefore, an orientation flat and spots other than it are different in light transmittance and hence the positioning of the silicon wafer can be performed easily.

Each of SOS and SOQ (Silicon on Quartz) processes has recently been used wherein a silicon thin film is formed over the surface of an insulated board of sapphire or quartz or the like, and an integrated circuit is formed over the silicon thin film. Since SOS and SOQ make use of the insulated board respectively, no leak current flows in a substrate like the silicon substrate and a reduction in power consumption is enabled. Therefore, each of SOS and SOQ has come to attention as a semiconductor device built in a portable type device in particular.

Since, however, the sapphire and quartz are high in light transmittance and a silicon thin film formed over its surface is also high in light transmittance because it becomes a monocrystal having a thickness of 1 μm or less, for example. Thus, it is not possible to detect an orientation flat by using the conventional optical sensor in a state of being kept intact.

Therefore, a patent document 1 (Japanese Unexamined Patent Publication No. Hei 11(1999)-220114) discloses a method of manufacturing a semiconductor device, wherein a silicon thin film for formation of circuit elements is formed over the surface of a sapphire substrate, and a light-penetration preventing polysilicon thick film is formed over its back, respectively, and an orientation flat is provided at the entire surface of the polysilicon thick film on the back, thereby preventing warpage and cracks of the substrate.

Further, a patent document 2 (Japanese Unexamined Patent Publication No. 2000-36585) discloses a method of manufacturing a semiconductor device, wherein in order to prevent warpage and cracks of a substrate due to a silicon thick film, a silicon thin film is formed on the obverse and reverse sides of a sapphire substrate, and silicon ions are implanted in the silicon thin film placed over the back thereof to amorphize the entire silicon thin film placed over the back, thereby forming a light-penetration preventing film.

As disclosed in, for example, the patent document 2, however, the conventional manufacturing method of semiconductor device needs to form a silicon oxide film over the silicon thin film placed over the surface of the sapphire substrate for the purpose of protection of the silicon thin film placed over the surface thereof before the implantation of the ions in the silicon thin film placed over the back thereof, and further to remove the silicon oxide film for the purpose of circuit formation after the ion implantation. It is also necessary to remove the light-penetration preventing film placed over the back after the completion of formation of the semiconductor device with respect to the silicon thin film placed over the surface. Thus, complex process steps were needed to form the light-penetration preventing film over the back.

SUMMARY OF THE INVENTION

It is an object of the present invention to provide a semiconductor wafer such as SOS, SOQ, etc., which can be simplified in manufacturing process and which produces no warpage and cracks in a wafer process and can be accurately positioned by an optical sensor, and a method of manufacturing the semiconductor wafer.

According to one aspect of the present invention, for achieving the object, there is provided a semiconductor wafer comprising an insulated board having a light-penetrating property, which is provided with a positioning orientation flat at a peripheral portion thereof, and a silicon thin film formed over the entire one surface of the insulated board, wherein silicon of the peripheral portion containing the orientation flat is amorphized within the silicon thin film.

According to another aspect of the invention, for achieving the object, there is provided a method of manufacturing a semiconductor wafer, comprising the steps of forming a silicon thin film over the entire one surface of an insulated board having a light-penetrating property, which is provided with a positioning orientation flat at a peripheral portion thereof, covering a central portion containing a device forming area of the silicon thin film with a resist mask, effecting ion implantation on an area for the peripheral portion containing the orientation flat of the insulated board within the silicon thin film, using the resist mask to thereby amorphize silicon in the area, and removing the resist mask after the ion implantation, wherein the respective steps are performed sequentially.

Since the amorphized silicon thin film is formed in the corresponding area provided with the positioning orientation flat at the peripheral portion of the semiconductor wafer in the present invention, the transparency of visible light is eliminated at the peripheral portion. Thus, even in the case of a light-transmitting semiconductor wafer like SOS or SOQ, an orientation flat is detected by an optical sensor to enable its precise positioning.

Since the semiconductor wafer of the present invention needs not have a light-penetration preventing film like a polysilicon thick film over its back, warpage and cracks in a wafer processing step do not occur, so that a high reliable semiconductor device can be formed.

Further, the method of manufacturing the semiconductor wafer according to the present invention forms the silicon thin film over one surface of the insulated board, covers the central portion of the silicon thin film with the resist mask, and effects ion implantation on the peripheral portion by use of the resist mask. Therefore, it is possible to form the semiconductor wafer by processing of only one surface of the insulated board. Thus, a manufacturing process can be simplified significantly as compared with the conventional manufacturing method which effects processing on both surfaces of the insulated board.

DETAILED DESCRIPTION OF THE PREFERRED EMBODIMENTS

A semiconductor wafer comprises an insulated board having a light-penetrating property, which is provided with a positioning orientation flat at a peripheral portion thereof, a silicon thin film formed over the entire one surface of the insulated board, and a silicon film having a rough surface formed over the entire surface of the insulated board, which is located on the opposite side of the silicon thin film. Such a semiconductor wafer can be manufactured by forming a silicon thin film and an oxide silicon film over the entire surface of an insulated board, forming an amorphized silicon film over the entire back thereof, effecting HSG (hemispherical grain) processing on the surface of the silicon film, and thereafter removing the oxide silicon film to expose the silicon thin film.

The above and other objects and novel features of the present invention will become more completely apparent from the following descriptions of preferred embodiments when the same is read with reference to the accompanying drawings. The drawings, however, are for the purpose of illustration only and by no means limitative of the invention.

First Preferred Embodiment

Figure 1A:
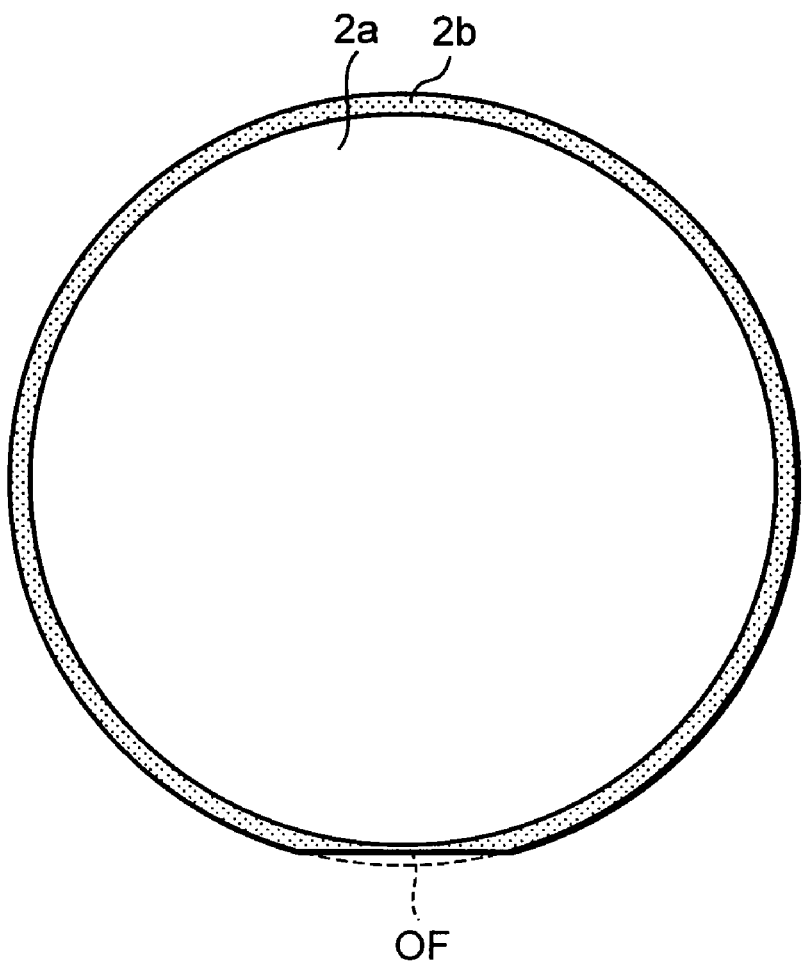
FIG. 1A–1B are configurational views of a semiconductor wafer showing a first embodiment of the present invention.
Figure 1B:
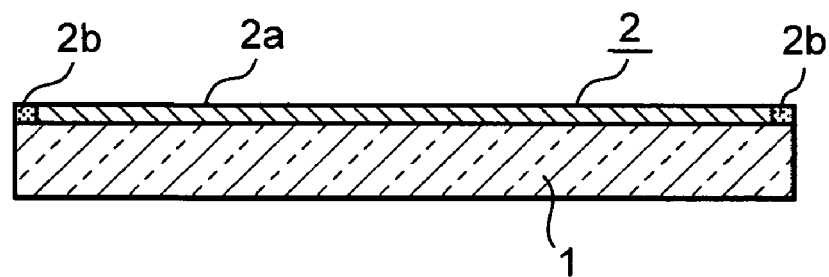

FIG. 1A–1B are configurational views of a semiconductor wafer showing a first embodiment of the present invention, wherein FIG. 1A is a plan view thereof and FIG. 1B is a cross-sectional view thereof respectively.

The present semiconductor wafer comprises a disk type sapphire substrate 1 provided with a positioning orientation flag (OF) at one point on its circumference, and a silicon thin film 2 formed over the entire surface of the sapphire substrate 1. The silicon thin film 2 is divided into an inner ring portion 2a reduced in diameter by about 10 mm from the diameter of the sapphire substrate 1, and an outer ring portion 2b having a width of about 5 mm, which extends along its outer circumference.

The inner ring portion 2a of the silicon thin film 2 is constituted of a crystalline silicon layer and equivalent to a portion which serves as a device forming area. The outer ring portion 2b corresponds to a positioning area formed of a silicon layer amorphized and low in light-penetrating property. The orientation flat OF is defined in the outer ring portion 2b so as not to extend to the inner ring portion 2a.

FIG. 2A–2D are process views showing a method of manufacturing the semiconductor wafer shown in FIG. 1A–1B. The manufacturing method of the semiconductor wafer shown in FIG. 1A–1B will be explained below with reference to FIG. 2A–2D.

Figure 2A:
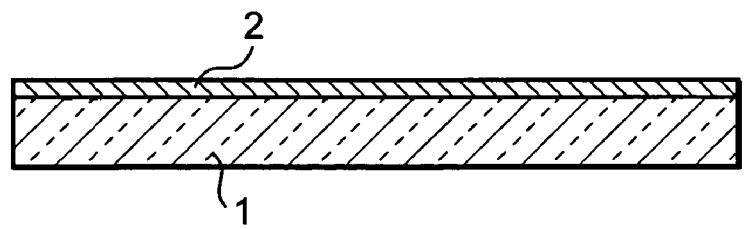
FIG. 2A–2D are process views showing a method of manufacturing the semiconductor wafer shown in FIG. 1A–1B.

(1) Process 1 (FIG. 2A)

A disk type sapphire substrate 1 provided with an orientation flat OF is prepared. A silicon thin film 2 having a thickness ranging from approximately 20 to 200 nm is formed over the entire surface of the sapphire substrate 1 by, for example, epitaxial growth.

Figure 2B:
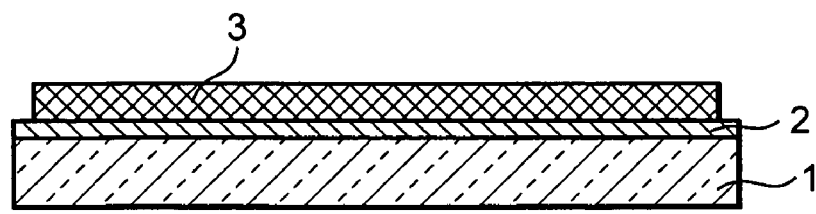

(2) Process 2 (FIG. 2B)

A resist agent 3, which serves as a mask at ion implantation, is applied onto the surface of the silicon thin film 2. Further, the resist agent 3 at the outer peripheral portion of the substrate is removed using, for example, photolithography with an effective device area lying in the substrate left behind. The width of the resist agent 3 to be removed is determined by the allowable range of a wafer position sensor of a device used for wafer processing and the effective device area lying in the substrate. However, the width thereof needs at least the maximum notch size (e.g., about 5 mm) or more of the orientation flat (OF).

Figure 2C:
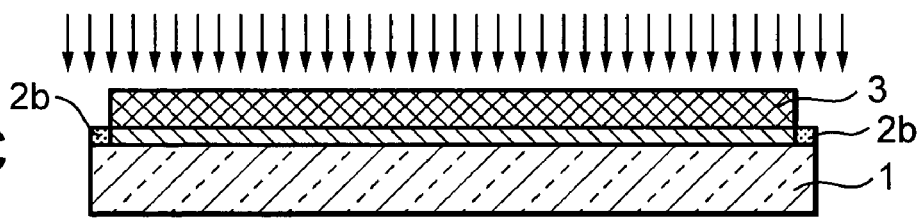

(3) Process 3 (FIG. 2C)

The implantation of ions is effected to amorphize the substrate outer peripheral portion of the silicon thin film 2 with the resist agent 3 from which the substrate outer peripheral portion has been removed, as the mask. Although the conditions for the ion implantation needs not to be strict in particular, an ion species is set to silicon, energy is set to 160 keV and the amount of dose is set to $5\times10^{14}/cm^2$. Incidentally, the ion species aims to collapse crystalline and is regardless of the type. When an oxide film or the like is formed over the silicon layer, the energy and the like are also set to suitable values according to its thickness so that the ions are capable of reaching the silicon layer. The temperature at the ion implantation may be a heat-resistant temperature (e.g., 100° C.) or less of the resist agent 3.

Figure 2D:
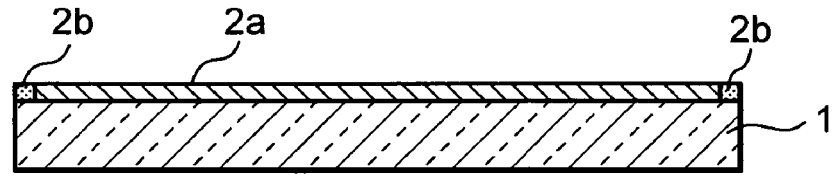

(4) Process 4 (FIG. 2D)

After the ion implantation, the resist agent 3 is removed. Thus, the crystalline silicon remains in the inner ring portion 2a of the silicon thin film 2 as it is, and the silicon of the outer ring portion 2b is amorphized so that transparency of visible light becomes low, thereby leading to completion of such a semiconductor wafer as shown in FIG. 1A–1B. Incidentally, if the once-amorphized silicon is held at 560° C. or less, then its state is maintained as it is, whereas if the temperature reaches 560° C. or higher, the silicon is recrystallized and returns to a transparent state. Thus, when the visible light is set so as to penetrate by high-temperature processing during a wafer processing step, the ion implantation is done again by a similar method to avoid the transparency of the visible light.

Thus, the semiconductor wafer according to the first embodiment has the silicon thin film having the amorphized outer ring portion 2b in such a manner that the visible light does not pass through the wafer peripheral portion containing the orientation flat OF. Accordingly, the positioning of the semiconductor wafer can be easily performed by searching the orientation flat OF of the outer ring portion 2b according to a method similar to one for the normal silicon wafer.

The semiconductor wafer has the advantages that since a light-penetration preventing film like a polysilicon thick film is not formed over its back surface, warpage in the wafer processing step can be reduced and cracks can be eliminated, and hence a high reliable semiconductor device can be formed.

Further, the semiconductor wafer has the advantage that since it can be formed by processing only the surface of the sapphire substrate 1, the manufacturing process can be simplified by far as compared with the conventional manufacturing method.

Second Preferred Embodiment

Figure 3:
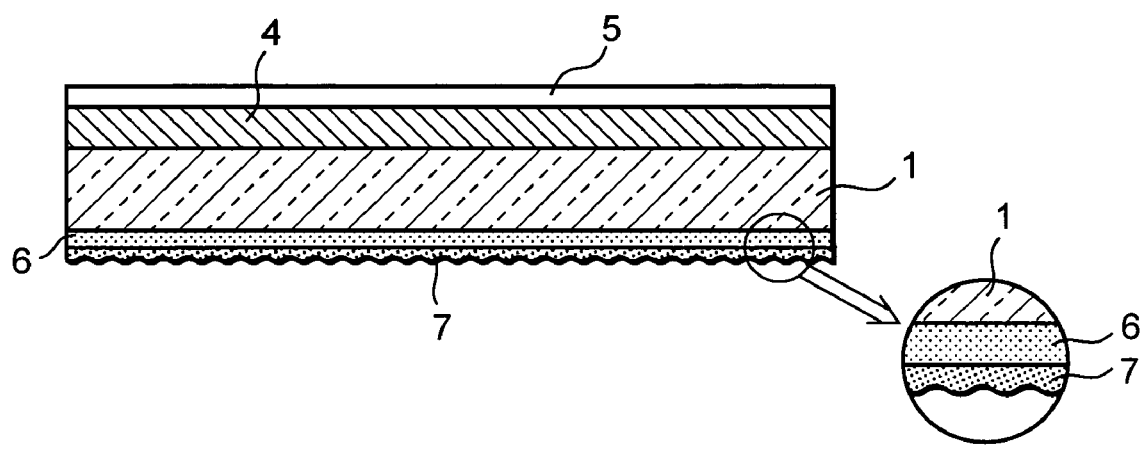
FIG. 3 is a cross-sectional view of a semiconductor wafer illustrating a second embodiment of the present invention.

FIG. 3 is a cross-sectional view of a semiconductor wafer showing a second embodiment of the present invention.

The semiconductor wafer includes a disk type sapphire substrate 1 provided with a positioning orientation flag (OF) at one point (not shown) on its circumference, and a silicon thin film 4 formed over the entire one surface of the sapphire substrate 1. An oxide silicon film 5 is formed over the entire surface of the silicon thin film 4. A silicon film having a rough surface, comprising an amorphized silicon film 6 and an HSG polysilicon film (hereinafter called simply "HSG film") 7, is formed over the entire surface of the sapphire substrate 1 lying on the side opposite to the surface of the sapphire substrate 1 on which the silicon thin film 4 is formed. The HSG film 7 is of a polysilicon film whose surface is roughened by hemispherical polysilicon grains and has the characteristic that light is scattered so that its transmittance is extremely reduced (10% or less, for example).

Such a semiconductor wafer can be manufactured in the following manner.

A disk type sapphire substrate 1 provided with an orientation flat OF is first prepared. A silicon thin film 4 having a thickness ranging from approximately 20 to 200 nm is formed over the entire surface of the sapphire substrate 1 by epitaxial growth, for example. Further, the entire surface of the silicon thin film 4 is oxidized to form an oxide silicon film 5.

Next, an amorphized silicon film 6 is formed over the entire back of the sapphire substrate 1 by using SiH4 gas at a temperature of 520° C., for example. Further, HSG processing is effected on the surface of the amorphized silicon film 6 to form an HSG film 7. The HSG processing is done using SiH4 gas by the UHV-600 type HSG-CVD apparatus made by ASM corporation under the conditions of a temperature of 560° C. and a pressure of $1 \times 10^{-5}$ Pa.

Thus, the HSG film 7 formed with hemispherical polysilicon grains is obtained at the surface of the amorphized silicon film 6. Under the conditions of such a temperature and pressure, the HSG film 7 is selectively formed only on the surface of the amorphized silicon film 6, and no HSG film is formed on the oxide silicon film 5 lying on the opposite side.

Thereafter, the oxide silicon film 5 formed over the surface of the silicon thin film 4 is removed, and wafer processing for the formation of circuit elements is effected on the exposed silicon thin film 4.

Since the semiconductor wafer according to the second embodiment has the HSG film 7 which allows the transmitted light to be scattered to the back surface of the wafer as described above, the semiconductor wafer can easily be positioned by searching the orientation flat OF according to a method similar to one for the normal silicon wafer.

The HSG film 7 has the advantages that since it may be a thin film because the HSG film 7 causes the light to be scattered by the hemispherical polysilicon grains lying on its surface, warpage in a wafer processing step can be reduced and cracks can be eliminated, thereby making it possible to form a high reliable semiconductor device. Further, the HSG film 7 has the advantage that there is no fear of the occurrence of a light-penetrating property in a high-temperature wafer processing step as distinct from the amorphized silicon film 2b employed in the first embodiment.

Third Preferred Embodiment

Figure 4A:
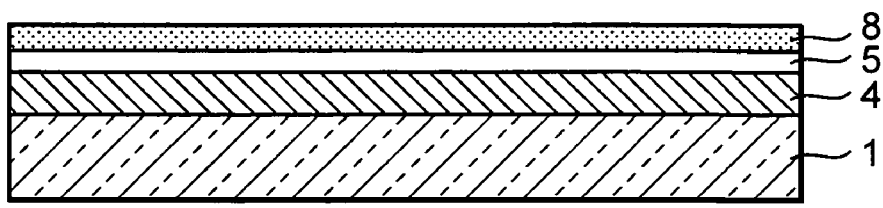
FIG. 4A–4C are cross-sectional views for describing a process for manufacturing a semiconductor wafer showing a third embodiment of the present invention.
Figure 4B:
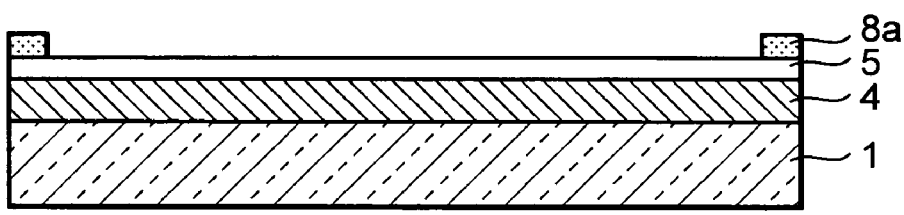
Figure 4C:
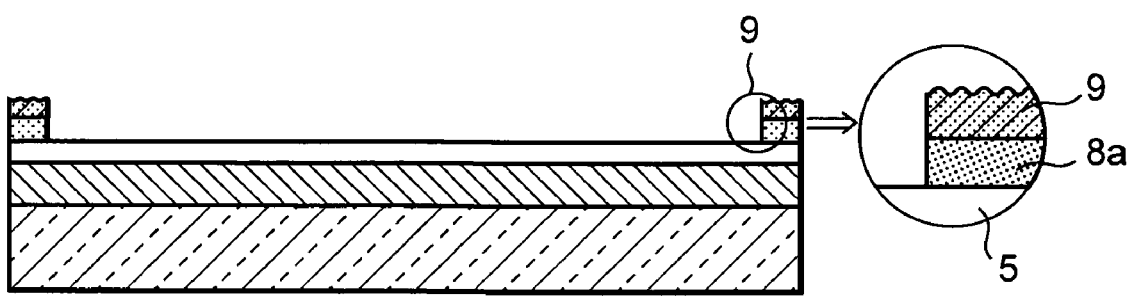

FIGS. 4A–4C are cross-sectional views for manufacturing a semiconductor wafer showing a third embodiment of the present invention.

As shown in FIG. 4C, the semiconductor wafer has a disk type sapphire substrate 1 provided with a positioning orientation flag OF at one point (not shown) on its circumference, a silicon thin film 4 formed over the entire one surface of the sapphire substrate 1, and an oxide silicon film 5 formed over the entire surface of the silicon thin film 4. Further, an amorphized silicon film 8a is formed over the surface of the oxide silicon film 5 at a peripheral portion containing the orientation flat OF, and an HSG film 9 is formed over the silicon film 8a.

The semiconductor wafer is formed by the following manufacturing method, for example.

As shown in FIG. 4A, a disk type sapphire substrate 1 provided with an orientation flat OF is first prepared. A silicon thin film 4 having a thickness ranging from approximately 20 to 200 nm is formed over the entire surface of the sapphire substrate 1 by epitaxial growth, for example. Further, the entire surface of the silicon thin film 4 is oxidized to form an oxide silicon film 5. An amorphized silicon film 8 is formed over the entire surface of the oxide silicon film 5 using SiH4 gas at a temperature of 520° C., for example.

Next, the peripheral portion of the silicon film 8 containing the orientation flat OF of the sapphire substrate 1 is left, and the inner silicon film 8 is removed by a lithography technique and an etching technique. Thus, as shown in FIG. 4B, the amorphized silicon film 8 is left on the oxide silicon film 5 at the peripheral portion containing the orientation flat OF.

Further, HSG processing is effected on the surface of the amorphized silicon film 8a to form an HSG film 9. The HSG processing is done using SiH4 gas by the HSG-CVD apparatus under the conditions of a temperature of 560° C. and a pressure of $1 \times 10^{-5}$ Pa. Thus, as shown in FIG. 4C, the HSG film 9 formed with hemispherical polysilicon grains is obtained at the surface of the amorphized silicon film 8a. Under the conditions of such a temperature and pressure, the HSG film 9 is selectively formed only on the surface of the amorphized silicon film 8a, and no HSG film is formed over the surface of the oxide silicon film 5 located thereinside.

Thereafter, the inner oxide silicon film 5 formed with no HSG film 9 is removed, and wafer processing for the formation of circuit elements is effected on the exposed silicon thin film 4.

As described above, the semiconductor wafer according to the third embodiment is formed with the HSG film 9 for causing visible light to be scattered to the wafer peripheral portion containing the orientation flat OF. Thus, the semiconductor wafer can easily be positioned by searching the orientation flat OF of the sapphire substrate 1 according to a method similar to one for the normal silicon wafer.

Thus, the semiconductor wafer has the advantage that since it can be formed by the processing to be effected only on the surface of the sapphire substrate 1, its manufacturing process can be simplified significantly as compared with the conventional manufacturing method. Also the semiconductor wafer has the advantages that since a light-penetration preventing film like a polysilicon thick film is not formed over its back surface, warpage in the wafer processing step can be reduced and cracks can be eliminated, and hence a high reliable semiconductor device can be formed. Further, the semiconductor wafer has the advantage that there is no fear of the occurrence of translucency in a high-temperature wafer processing step as distinct from the amorphized silicon film 2b employed in the first embodiment.

Fourth Preferred Embodiment

Incidentally, the embodiments referred to above can be implemented by various changes. For example, the following embodiments are brought about as modifications thereof.

(a) Although a description has been made of the SOS based on the sapphire substrate 1, the present invention is similarly applicable even to SOQ based on a quartz substrate.

(b) The conditions such as the illustrated sizes, materials, temperatures, etc. are shown by way of example. They can be suitably changed depending on applicable conditions.

(c) Although the disk type semiconductor wafer has been described, the present invention is not limited to the disk type. The present invention is similarly applicable even to a semiconductor wafer having a positioning orientation flat at its peripheral portion. In such a case, preferably, a silicon thin film in a device forming area located in the center of the semiconductor wafer is crystallized and a silicon thin film at a peripheral portion containing the orientation flat is formed to an amorphized state.

(d) The shape of the orientation flat OF provided around the semiconductor wafer is arbitrary.

(e) A rough-surfaced polysilicon film may be directly formed over the back of the sapphire substrate 1 as an alternative to the silicon film 6 and HSG film 7 lying over the back of the sapphire substrate 1 employed in the second embodiment. The rough-surfaced polysilicon film is formed using, for example, SiH4 gas under the conditions of a temperature of 575° C. and a pressure of 650 Pa or so. Thus, the polysilicon film which is rough in surface and causes transmitted light to be scattered, can be uniformly formed over the back of the sapphire substrate 1.

(f) Although the inner side of the amorphized silicon film 8 is removed and the HSG film 9 is formed over the surface of the silicon film 8a of the remaining peripheral portion in the third embodiment, the HSG film 9 is formed over the entire surface of the silicon film 8 and thereafter the peripheral portion containing the orientation flat OF is left and the HSG film 9, silicon film 8 and oxide silicon film 5 provided on the inner side may be removed.

(g) In a manner similar to the above (e), a rough-surfaced polysilicon film may be provided as an alternative to the silicon film 8a and HSG film 9 employed in the third embodiment.

(h) The conditions and procedures for the HSG processing in the second and third embodiments are illustrated by way of example. The HSG processing can be done under various conditions. For example, a patent document 3 describes that as a method of bringing the surface of a stacked electrode of a DRAM (stacked memory cell) into HSG form, a substrate having produced the stacked electrode, is placed under a reduced pressure of about 0.13 Pa at a temperature of about 580° C. and subjected to Si2H6 gas for about 10 minutes, followed by being continuously subjected to an atmosphere of N2 for about 30 minutes under isothermal and isobaric conditions. Further, the patent document 3 shows data that in the relationship between reflectivity of a formed HSG surface and the wavelength of light, the reflectivity becomes a minimal 5% or so when the wavelength is about 660 nm, whereas when the wavelength is 633 nm, the reflectivity becomes 10% or so.

While the preferred forms of the present invention have been described, it is to be understood that modifications will be apparent to those skilled in the art without departing from the spirit of the invention. The scope of the invention is to be determined solely by the following claims.

What is claimed is:
1. A semiconductor wafer comprising:
an insulated board having a light-penetrating property, which is provided with a positioning orientation flat at a peripheral portion thereof; and
a silicon thin film formed over the entirety of one surface of the insulated board,
wherein silicon of the peripheral portion containing the orientation flat is amorphized within the silicon thin film.
2. The semiconductor wafer according to claim 1, wherein the insulated board is a sapphire substrate.

* * * * *